United States Patent [19]

Katano

[11] Patent Number: 5,087,950
[45] Date of Patent: Feb. 11, 1992

[54] SCHOTTKY BARRIER JUNCTION GATE FIELD EFFECT TRANSISTOR

[75] Inventor: Fumiaki Katano, Tokyo, Japan

[73] Assignee: NEC Corporation, Tokyo, Japan

[21] Appl. No.: 660,897

[22] Filed: Feb. 26, 1991

[30] Foreign Application Priority Data

Feb. 26, 1990 [JP] Japan .................................. 2-45068

[51] Int. Cl.$^5$ ............................................. H01L 29/80
[52] U.S. Cl. ...................................... 357/22; 357/15; 357/16
[58] Field of Search .................. 357/22 I, 22 J, 22 K, 357/22 A, 22 MD, 15, 16

[56] References Cited

U.S. PATENT DOCUMENTS

| | | | |
|---|---|---|---|
| H368 | 11/1987 | Yoder | 357/22 I |
| 4,393,578 | 7/1983 | Cady et al. | 357/22 J |
| 4,636,822 | 1/1987 | Codella et al. | 357/22 I |

Primary Examiner—Andrew J. James
Assistant Examiner—Sara W. Crane
Attorney, Agent, or Firm—Burns, Doane, Swecker & Mathis

[57] ABSTRACT

A schottky barrier junction gate type field effect transistor includes a buffer layer formed on a semi-insulating GaAs substrate and including at least an undoped GaAs crystalline layer, a first n-type GaAs crystalline layer of a first carrier concentration formed on the buffer layer, and a second n-type GaAs crystalline layer formed on the first n-type GaAs crystalline layer and having a second carrier concentration which is lower than the first carrier concentration. A gate electrode made of a Schottky barrier metal is formed on the second n-type GaAs crystalline layer, and a pair of ohmic electrodes are formed at opposite sides of the gate electrode separately from the gate electrode. A third n-type GaAs crystalline layer is formed under each of the pair of ohmic electrodes and has a third carrier concentration which is higher than the first carrier concentration, and a fourth n-type GaAs crystalline layer is formed between the third n-type GaAs crystalline layer and a region which is composed of the first and second n-type GaAs crystalline layers. The fourth n-type GaAs crystalline layer has a fourth carrier concentration which is not less than the first carrier concentration, and a thickness corresponding to a total thickness of the first and second n-type GaAs crystalline layers.

8 Claims, 1 Drawing Sheet

SCHOTTKY BARRIER JUNCTION GATE FIELD EFFECT TRANSISTOR

BACKGROUND OF THE INVENTION

1. Field of the Invention

The present invention relates to a Schottky barrier junction gate type field effect transistor, and more specifically to such a transistor having decreased parasitic resistance and capacitance.

2. Description of Related Art

In the prior art, of Schottky barrier junction gate type field effect transistors (called "MESFET" hereinafter), a GaAs (gallium-arsenide) MESFET having an active layer formed of an n-type GaAs crystalline layer has an excellent characteristics as a high frequency device, and GaAs MESFET elements typified by a high frequency amplification elements have been developed and supplied into commercial market.

Referring to FIG. 1, there is shown a diagrammatic sectional view of a typical conventional GaAs MESFET.

As shown in FIG. 1, the GaAs MESFET includes a semiinsulating GaAs substrate 11 having crystalline layers 12, 35, 36 and 37 formed on the substrate 11 by an epitaxial growth process in the named order. Specifically, the layer 12 is composed of an undoped GaAs layer having a thickness of 0.5 μm, and the layer 35 is composed of an n-type GaAs layer having a thickness of 530 Å and a carrier concentration of $5 \times 10^{17}$ cm$^{-3}$. The layer 36 is composed of an n-type GaAs layer having a thickness of 1000 Å and a carrier concentration of $3 \times 10^{16}$ cm$^{-3}$, and the layer 37 is composed of a high concentration n-type GaAs layer having a thickness of 600 Å and a carrier concentration of $1 \times 10^{18}$ cm$^{-3}$. A gate electrode 38, a source electrode 39 and a drain electrode 40 are formed as shown, and the gate electrode 38 is formed on the n-type GaAs layer 36 by etching the high concentration n-type GaAs layer 37.

The above mentioned construction of the GaAs MESFET has a large transconductance and a small gate bias dependency, since an n-type GaAs layer under the gate electrode is of a double-layer structure composed of the low carrier concentration layer 36 and the high carrier concentration layer 37. In addition, since the gate electrode is on the low carrier concentration layer 36, a gate break down voltage is large, and a capacitance of the Schottky junction formed between the gate electrode and the n-type GaAs layer.

Furthermore, since a GaAs region between the gate electrode region and each of the source electrode region and the drain electrode region is constituted of the high concentration n-type GaAs layer 37, the parasitic resistance has been reduced.

In the above mentioned conventional GaAs MESFET, however, the source electrode 39 and the drain electrode 40, which are ohmic contact electrodes, are not directly contacted to the n-type GaAs layer 35 forming an active layer. Namely, the source electrode 39 and the drain electrode 40 are contacted through the low concentration n-type GaAs layer 36 to the n-type GaAs layer 35, and therefore, reduction of the parasitic resistance has not been sufficient. In addition, since the gate electrode 38 is in physical contact with the high concentration n-type GaAs layer 37, a parasitic capacitance has been large.

Furthermore, in order to provide the gate electrode 38, it has been necessary to partially etch the high concentration n-type GaAs layer 37. However, since it is not possible to avoid dispersion in the etching process, MESFETs cannot have a stable and uniform characteristics.

SUMMARY OF THE INVENTION

Accordingly, it is an object of the present invention to provide a MESFET which has overcome the above mentioned defect of the conventional one.

Another object of the present invention is to provide a MESFET having a reduced parasitic resistance and a reduced parasitic capacitance.

Still another object of the present invention is to provide a MESFET which can be manufactured with using no etching process for formation of a gate electrode.

The above and other objects of the present invention are achieved in accordance with the present invention by a Schottky barrier junction gate type field effect transistor including a semi-insulating GaAs substrate, a buffer layer formed on the substrate and including at least an undoped GaAs crystalline layer, a first n-type GaAs crystalline layer having a first carrier concentration and formed on the buffer layer, a second n-type GaAs crystalline layer formed on the first n-type GaAs crystalline layer and having a second carrier concentration which is lower than the first carrier concentration, a gate electrode made of a Schottky barrier metal and formed on the second n-type GaAs crystalline layer, and a pair of ohmic electrodes formed at opposite sides of the gate electrode separately from the gate electrode. The Schottky barrier junction gate type field effect transistor also comprises a third n-type GaAs crystalline layer formed under each of the pair of ohmic electrodes and having a third carrier concentration which is higher than the first carrier concentration, and a fourth n-type GaAs crystalline layer formed between the third n-type GaAs crystalline layer and a region which is composed of the first and second n-type GaAs crystalline layers, the fourth n-type GaAs crystalline layer having a fourth carrier concentration which is not less than the first carrier concentration, and a thickness corresponding to a total thickness of the first and second n-type GaAs crystalline layers.

According to another aspect of the present invention, there is provided a Schottky barrier junction gate type field effect transistor which includes a semi-insulating substrate of a compound semiconductor, a buffer layer formed on the substrate and including at least an undoped crystalline layer of the compound semiconductor, a first crystalline layer of the compound semiconductor having a first conduction type and a first carrier concentration and formed on the buffer layer, a second crystalline layer of the compound semiconductor formed on the first crystalline layer and having a second carrier concentration which is lower than the first carrier concentration, a gate electrode made of a Schottky barrier metal and formed on the second crystalline layer, and a pair of ohmic electrodes formed at opposite sides of the gate electrode separately from the gate electrode, the Schottky barrier junction gate type field effect transistor comprising a third crystalline layer of the compound semiconductor formed under each of the pair of ohmic electrodes and having a third carrier concentration which is higher than the first carrier concentration, and a fourth crystalline layer of the compound semiconductor formed between the third crystalline layer and a region which is composed of the first and second crystalline layers, the fourth crystalline layer having a fourth carrier concentration which is not less than the first carrier concentration, and a thickness corresponding to a total thickness of the first and second crystalline layers.

The above and other objects, features and advantages of the present invention will be apparent from the following description of preferred embodiments of the invention with reference to the accompanying drawings.

BRIEF DESCRIPTION OF THE DRAWOMGS

FIG. 1 is a diagrammatic sectional view of a typical conventional GaAs MESFET; and FIG. 2 is a diagrammatic sectional view of an embodiment of the GaAs MESFET in accordance with the present invention.

DESCRIPTION OF THE PREFERRED EMBODIMENTS

Figure 2:
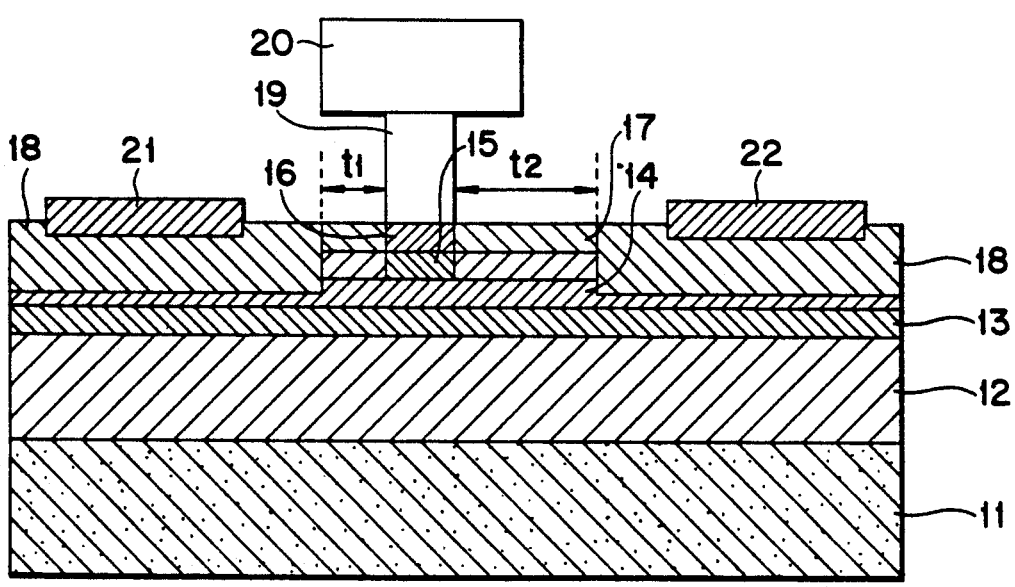

Referring to FIG. 2, there is shown a diagrammatic sectional view of an embodiment of the GaAs MESFET in accordance with the present invention.

In the shown GaAs MESFET, an undoped GaAs crystalline layer 12 having a thickness of 1 $\mu$m, and undoped AlGaAs crystalline layer 13 having a thickness of 2000 Å, and an undoped GaAs crystalline layer 14 having a thickness of 500 Å are formed on a semi-insulating GaAs substrate 11 in the named order to constitute a buffer layer. An n-type crystalline GaAs layer 15 having a thickness of 730 Å and a carrier concentration of $3 \times 10^{17}$ cm$^{-3}$ is formed on the undoped GaAs crystalline layer 14. An n-type GaAs layer 16 having a thickness of 600 Å and a carrier concentration of $5 \times 10^{16}$ cm$^{-3}$ is formed on the GaAs crystalline layer 15.

The crystalline layers 12 to 16 are sequentialy formed in an epitaxial growth process by use of a MBE (molecular beam epitaxy) method or a MOVPE (metal organic vapor phase epitaxy) method.

A crystalline layer 17 is formed by parts of the crystalline layers 15 and 16, and therefore, has a thickness corresponding to a sum of the thickness of the crystalline layer 15 and the thickness of the crystalline layer 16. An upper layer portion of the crystalline layer 17 is composed of an n-type GaAs layer which is formed by implanting silicon ions into a portion of a layer formed as the n-type GaAs layer 16, under an acceleration energy of 50 KeV and a dosage of $2 \times 10^{12}$ ions/cm$^2$, (and for example using the gate electrode 19 as a mask) and thereafter by electrically activating the doped portion. An averaged carrier concentration of the doped portion is substantially equal to that of the n-type GaAs layer 15 which forms an lower layer portion of the crystalline layer 17. In addition, the crystalline layer 17 at each side of the gate electrode 19 is in alignment with the gate electrode 19.

A crystalline layer 18 is composed of a high concentration n-type GaAs layer which is formed by implanting silicon ions into a portion of layers formed as the GaAs layers 14, 15 and 16, under an acceleration energy of 100 KeV and a dosage of $2 \times 10^{13}$ ions/cm$^2$, and thereafter by electrically activating the doped portion. An averaged carrier concentration of the doped portion is $1 \times 10^{18}$ cm$^{-3}$.

An electrode 19 provided on the crystalline layer 16 is formed of a metal that forms a Schottky barrier between the n-type GaAs crystalline layer 16 and the electrode 19. For example, the electrode 19 is formed of tungsten silicide. Another electrode 20 is formed on the electrode 19. This electrode 20 is made of a low resistance metal which decreases the gate resistance, for example, a metal of a stacked structure formed of titanium, platinum and gold. The electrodes 19 and 20 forms a T-shape gate having a gate length of 0.3 $\mu$m.

Electrodes 21 and 22 are formed on the high concentration n-type GaAs crystalline layer 18 at opposite sides of the gate electrode, respectively, and separately from the layers 17. These electrodes 21 and 22 are formed of a metal that forms an ohmic contact between the high concentration n-type GaAs crystalline layer 18 and the electrodes 21 and 22. For example, the electrodes 21 and 22 are formed of an alloy of gold, germanium and nickel. In the shown example, the electrode 21 forms a source electrode and the electrode 22 forms a drain electrode.

As mentioned above, the shown embodiment of the GaAs MESFET includes the buffer layer (12 to 14) including the undoped GaAs crystalline layer formed on the semi-insulating GaAs substrate 11, the n-type GaAs crystalline layer 15 of a middle carrier concentration ($3 \times 10^{17}$ cm$^{-3}$) formed on the buffer layer, and the n-type GaAs crystalline layer 16 of a low carrier concentration ($5 \times 10^{16}$ cm$^{-3}$) formed on the n-type GaAs crystalline layer 15. The gate electrode 19 made of a Schottky barrier metal is formed on the n-type GaAs crystalline layer 16, and the pair of ohmic electrodes 21 and 22 are formed at opposite sides of the gate electrode separately from the gate electrode. The n-type GaAs crystalline layer 18 of the high carrier concentration ($1 \times 10^{18}$ cm$^{-3}$) is formed under each of the pair of ohmic electrodes 21 and 22. Between the n-type GaAs crystalline layer 18 and a region which is composed of the n-type GaAs crystalline layers 15 and 16, there is formed the n-type GaAs crystalline layer 17 having a carrier concentration equal to the carrier concentration of the n-type GaAs crystalline layer 15, and a thickness equal to a sum of the thickness of the n-type GaAs crystalline layer 15 and the thickness of the n-type GaAs crystalline layer 16.

Figure 1:
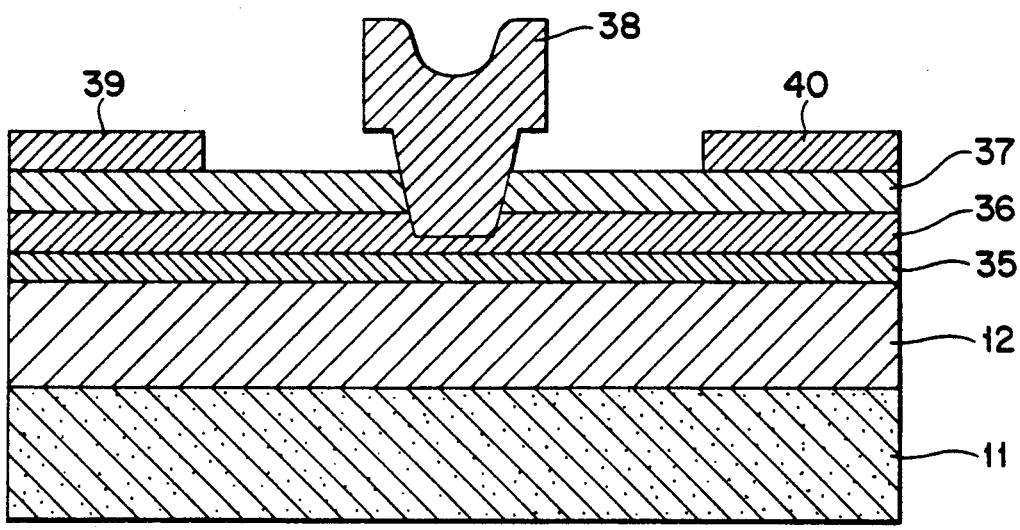

In the above mentioned GaAs MESFT, since the ohmic electrodes 21 and 22 are connected through the high concentration n-type GaAs crystalline layer 18 to the active layer 15, and since the GaAs crystalline layer 17 between the gate electrode region and the high concentration n-type GaAs crystalline layer 18 also has a high carrier concentration, the parasitic resistance is reduced. The source resistance of 0.7$\Omega$·mm was obtained. Since the gate electrode 19 are formed on the low concentration GaAs crystalline layer 16 having the carrier concentration of $5 \times 10^{16}$ cm$^{-3}$, the gate-drain break down voltage is as large as 19 V. Furthermore, since the gate electrode does not directly contact with the high concentration n-type GaAs crystalline layer, differently from the conventional MESFET shown in FIG. 1, the parasitic capacitance is decreased.

In addition, the shown embodiment is such that a distance $t_2$ (0.6 $\mu$m) between the gate electrode 19 and the drain side high concentration n-type GaAs crystalline layer 18 is larger than a distance $t_1$ (0.3 $\mu$m) between the gate electrode 19 and the source side high concentration n-type GaAs crystalline layer 18. This is effective in increasing the gate-drain break down voltage and in decreasing the parasitic capacitance.

In a power FET constructed in accordance with the present invention having a gate width of 840 μm, a 1 dB compression point output of 24.8 dBm and a linear gain of 8.4 dB were obtained under a measurement frequency of 18 GHz.

In the shown embodiment, in addition, the crystalline thickness of the GaAs layer portion under the gate electrode is the same as that of the other GaAs layer portion. Namely, since it is not necessary to etch the GaAs crystalline layer under the gate electrode, it is possible to decrease causes of dispersion in the manufacturing process, and therefore to increase the yield of manufacturing.

In the shown embodiment, the buffer layer is in a three-layer structure composed of the undoped GaAs crystalline layer 12, the undoped AlGaAs crystalline layer 13 and the undoped GaAs crystalline layer 14. The undoped AlGaAs crystalline layer is provided for the purpose of suppressing an electric current flowing the substrate and the decrease of the transconductance at a low current bias condition. A similar effect can be obtained not only by the undoped AlGaAs crystalline layer, but also by a p-type GaAs crystalline layer, a p-type AlGaAs crystalline layer, or a superlattice layer of GaAs crystalline layers and AlGaAs crystalline layers.

If these crystalline layers cannot be formed because of restriction in the manufacturing process, the buffer layer can be formed of only an undoped GaAs crystalline layer.

Furthermore, the carrier concentration of the GaAs crystalline layer 17 between the high concentration GaAs crystalline layer 18 and the gate electrode region (the region directly under the gate electrode) can be larger than the carrier concentration of the n-type GaAs crystalline layer 15 but smaller than the carrier concentration of the high concentration n-type GaAs crystalline layer 18. For example, under the conditions of the above mentioned embodiment, when the carrier concentration of the GaAs crystalline layer 17 was made at $6 \times 10^{17}$ cm$^{-3}$, the parasitic resistance could be further decreased in comparison with the above mentioned embodiment, and the source resistance of 0.6Ω·mm. This construction could be realized by executing the ion implantation for formation of the crystalline layer 17 by a double ion implanations in which ions are implanted to the crystalline layers 16 and 15 under acceleration energies of 80 KeV and 50 KeV, respectively.

The carrier concentrations of the respective layers 15, 16, 17 and 18 are in no way limited to the above mentioned values. If the layers 15 and 16 are replaced by a single layer, the single layer is preferred to have a carrier concentration in the range of 1 to $2.5 \times 10^{17}$ cm$^{-3}$. Therefore, in the shown embodiment, the carrier concentration of the layer 15 is made slightly larger than the preferred carrier concentration of the single layer, and the carrier concentration of the layer 16 is made slightly smaller than the preferred carrier concentration of the single layer. Preferably, the carrier concentration of the layers 15 and 17 is in the range of 2 to $6 \times 10^{17}$ cm$^{-3}$, and the carrier concentration of the layer 16 is in the range of 3 to $8 \times 10^{16}$ cm$^{-3}$. On the other hand, the carrier concentration of the layer 18 is preferred to be as high as possible, so as to reduce the resistance. However, the carrier concentration realized by the ion implantation has an upper limit. In practice, the carrier concentration of the layer 18 is in the range of 1 to $3 \times 10^{18}$ cm$^{-3}$.

As seen from the above explanation, the GaAs MESFET in accordance with the present invention is such that the gate electrode is formed on the low concentration n-type GaAs crystalline layer and the source and drain electrodes are connected through the high concentration n-type GaAs crystalline layer to the active n-type GaAs crystalline layer, without intermediary of the low concentration n-type GaAs crystalline layer. In addition, the GaAs crystalline layer between the gate electrode region and each high concentration n-type GaAs crystalline layer is made to have a low resistance. As a result, the parasitic resistance is decreased.

Furthermore, since the high concentration n-type GaAs crystalline layer is not in close proximity of the gate electrode, the parasitic capacitance is small. In addition, since it is not necessary to etch the crystalline layer under the gate electrode, dispersion in the manufacturing process can be effectively suppressed, and therefore, GaAs MESFETs having a stable characteristics can be manufactured with a good yield of production.

The invention has thus been shown and described with reference to the specific embodiments. However, it should be noted that the present invention is in no way limited to the details of the illustrated structures but changes and modifications may be made within the scope of the appended claims.

I claim:

1. A Schottky barrier junction gate type field effect transistor which includes a semi-insulating gallium-arsenide (GaAs) substrate, a buffer layer formed on said substrate and including at least an undoped GaAs crystalline layer, a first n-type GaAs crystalline layer having a first carrier concentration and formed on said buffer layer, a second n-type GaAs crystalline layer formed on said first n-type GaAs crystalline layer and having a second carrier concentration which is lower than said first carrier concentration, a gate electrode made of a Schottky barrier metal and formed on said second n-type GaAs crystalline layer, and a pair of ohmic electrodes formed at opposite sides of said gate electrode separately from said gate electrode, the Schottky barrier junction gate type field effect transistor comprising a third n-type GaAs crystalline layer formed under each of said pair of ohmic electrodes and having a third carrier concentration which is higher than said first carrier concentration, and a fourth n-type GaAs crystalline layer formed between said third n-type GaAs crystalline layer and a region which is composed of said first and second n-type GaAs crystalline layers, said fourth n-type GaAs crystalline layer having a fourth carrier concentration which is not less than said first carrier concentration, and a thickness corresponding to a total thickness of said first and second n-type GaAs crystalline layers.

2. A Schottky barrier junction gate type field effect transistor claimed in claim 1 wherein said buffer layer is formed in a three-layer structure composed of a first undoped GaAs crystalline layer formed on said substrate, an undoped AlGaAs crystalline layer formed on first undoped GaAs crystalline layer and a second undoped GaAs crystalline layer formed on the AlGaAs crystalline layer.

3. A Schottky barrier junction gate type field effect transistor claimed in claim 1 wherein said buffer layer is formed in a three-layer structure composed of a first undoped GaAs crystalline layer formed on said substrate, an undoped intermediate crystalline layer formed on first undoped GaAs crystalline layer and a second undoped GaAs crystalline layer formed on the intermediate crystalline layer, said intermediate crystalline layer being formed of a p-type GaAs crystalline layer, a p-type AlGaAs crystalline layer, or a superlattice layer of GaAs crystalline layers and AlGaAs crystalline layers.

4. A Schottky barrier junction gate type field effect transistor claimed in claim 1 wherein said buffer layer is formed of a single undoped GaAs crystalline layer.

5. A Schottky barrier junction gate type field effect transistor claimed in claim 1 wherein said fourth carrier concentration of said fourth n-type GaAs crystalline layer is larger than said first carrier concentration but lower than said third carrier concentration.

6. A Schottky barrier junction gate type field effect transistor claimed in claim 1 wherein a distance between said gate electrode and a drain side region of said third n-type GaAs crystalline layer is larger than a distance between said gate electrode and a source side region of said third n-type GaAs crystalline layer.

7. A Schottky barrier junction gate type field effect transistor claimed in claim 1 wherein said first and fourth carrier concentrations are in the range of 2 to $6 \times 10^{17}$ cm$^{-3}$, said second carrier concentration is in the range of 3 to $8 \times 10^{16}$ cm$^{-3}$, and said third carrier concentration is in the range of 1 to $3 \times 10^{18}$ cm$^{-3}$.

8. A Schottky barrier junction gate type field effect transistor which includes a semi-insulating substrate of a compound semiconductor, a buffer layer formed on said substrate and including at least an undoped crystalline layer of said compound semiconductor, a first crystalline layer of said compound semiconductor having a first conduction type and a first carrier concentration and formed on said buffer layer, a second crystalline layer of said compound semiconductor formed on said first crystalline layer and having a second carrier concentration which is lower than said first carrier concentration, a gate electrode made of a Schottky barrier metal and formed on said second crystalline layer, and a pair of ohmic electrodes formed at opposite sides of said gate electrode separately from said gate electrode, the Schottky barrier junction gate type field effect transistor comprising a third crystalline layer of said compound semiconductor formed under each of said pair of ohmic electrodes and having a third carrier concentration which is higher than said first carrier concentration, and a fourth crystalline layer of said compound semiconductor formed between said third crystalline layer and a region which is composed of said first and second crystalline layers, said fourth crystalline layer having a fourth carrier concentration which is not less than said first carrier concentration, and a thickness corresponding to a total thickness of said first and second crystalline layers.

* * * * *